United States Patent
Rajendran et al.

(10) Patent No.: US 8,195,109 B2
(45) Date of Patent: Jun. 5, 2012

(54) SINGLE ENDED SWITCHED POWER AMPLIFIER WITH TUNED LOAD COUPLING BLOCK

(75) Inventors: Gireesh Rajendran, Trivandrum (IN); Apu Sivadas, Bangalore (IN); Subhashish Mukherjee, Bangalore (IN); Krishnaswamy Thiagarajan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 12/729,965

(22) Filed: Mar. 23, 2010

(65) Prior Publication Data
US 2011/0237206 A1 Sep. 29, 2011

(51) Int. Cl.
*H01Q 11/12* (2006.01)
*H04B 1/04* (2006.01)

(52) U.S. Cl. .................................. 455/127.1; 330/252
(58) Field of Classification Search .................. 455/93, 455/127.1, 127.2; 375/295; 330/252, 253, 330/254, 261
See application file for complete search history.

(56) References Cited

U.S. PATENT DOCUMENTS
2007/0087711 A1* 4/2007 Pan ........................... 455/127.4
2010/0085097 A1* 4/2010 Bryant ........................ 327/175
* cited by examiner

*Primary Examiner* — Nguyen Vo
(74) *Attorney, Agent, or Firm* — Lawrence J. Bassuk; W. James Brady; Frederick J. Telecky, Jr.

(57) ABSTRACT

A switched power amplifier contained in a circuit is implemented to receive a single-ended input signal and generate a single-ended output signal, the single-ended output signal being a power-amplified version of the single-ended input signal. The switched power amplifier provides high efficiency.

10 Claims, 2 Drawing Sheets

SINGLE ENDED SWITCHED POWER AMPLIFIER WITH TUNED LOAD COUPLING BLOCK

BACKGROUND

1. Technical Field

Embodiments of the present disclosure relate generally to amplifiers, and more specifically to a switched power amplifier topology providing high efficiency.

2. Related Art

Power amplifiers are generally used to boost the power level of an input signal. Power amplifiers contain one or more components (conveniently referred to as power-control elements) that control the manner in which power amplification is achieved. When the power-control elements in a power amplifier are used in an ON/OFF or switched manner in performing power amplification, the power amplifiers are termed switched power amplifiers.

In contrast, when the power-control elements are used in a linear region of operation (and not in an ON/OFF manner) at least for some duration of the power conversion operation, the power amplifiers are termed linear power amplifiers. Switched power amplifiers may be realized using several topologies, the term topology generally referring to the specific arrangement and/or interconnections of the components of the switched power amplifier.

Efficiency of a power amplifier (switched type or otherwise) is generally the ratio of the power delivered to a load and the power consumed by the power amplifier in delivering the power to the load.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning, of the claims.

A switched power amplifier contained in a circuit is implemented to receive a single-ended input signal and generate a single-ended output signal, the single-ended output signal being a power-amplified version of the single-ended input signal. The switched power amplifier provides high efficiency.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Device

Figure 1:
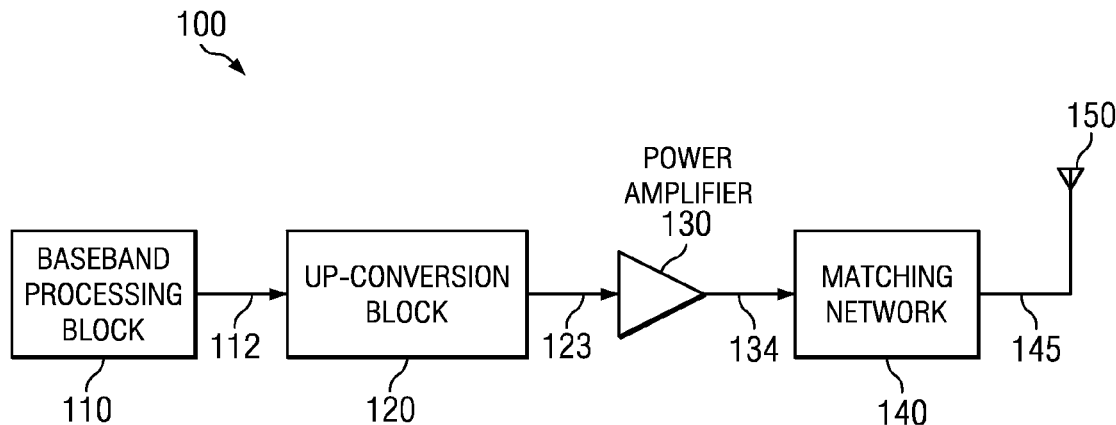
FIG. 1 is a block diagram of an example device in which several embodiments can be implemented.

FIG. 1 is a block diagram of an example device in which several embodiments may be implemented. Bluetooth transceiver 100 is shown containing baseband processing block 110, up-conversion block 120, power amplifier 130, matching network 140 and antenna 150. The block diagram of FIG. 1, as well as the corresponding description below is provided merely by way of illustration. Various other blocks and sub-blocks (for example, components in the receive chain of Bluetooth transceiver 100) are not shown for conciseness, but maybe implemented as part of Bluetooth transceiver 100. Further, the techniques described below can be implemented in devices other than a Bluetooth transceiver as well, such as for example, in Wireless LAN transceivers.

Baseband processing block 110 generates data to be transmitted by Bluetooth transceiver 100. Baseband processing block 110 may perform several baseband processing operations on data to be sent on path 112. The operations may include signal processing operations such as filtering, encoding, decoding, encryption, decryption, modulation, digital-to-analog (DAC) conversion, etc. Baseband processing block 110 may contain multiple processing units, with each processing unit potentially being designed for a specific task. Alternatively, baseband processing block 110 may contain only a single processing unit (general purpose processor, digital signal processor, etc.). Baseband processing block 110 provides, on path 112, modulated signals in analog form to up-conversion block 120.

Up-Conversion block 120 translates the signal received on path 112 to a higher frequency band (e.g., 2.4 GHz band). Up-Conversion block 120 provides the up-converted signal on path 123 to power amplifier 130. Power amplifier 130 provides power amplification to the signal received on path 123, and provides a corresponding power-amplified output on path 134 to antenna 150 via matching network 140. Matching network 140 is used to match the output impedance of power amplifier 130 to the input impedance of antenna 150, and maybe implemented in a known way. Antenna 150 transmits the signal received on path 145 on a wireless medium.

Power amplifier 130 may be implemented as a switched power amplifier to provide high efficiency. Some of the features of power amplifier 130 will be clearer in comparison with a prior implementation, and accordingly the prior implementation is described first.

2. Prior Topology

Figure 2:
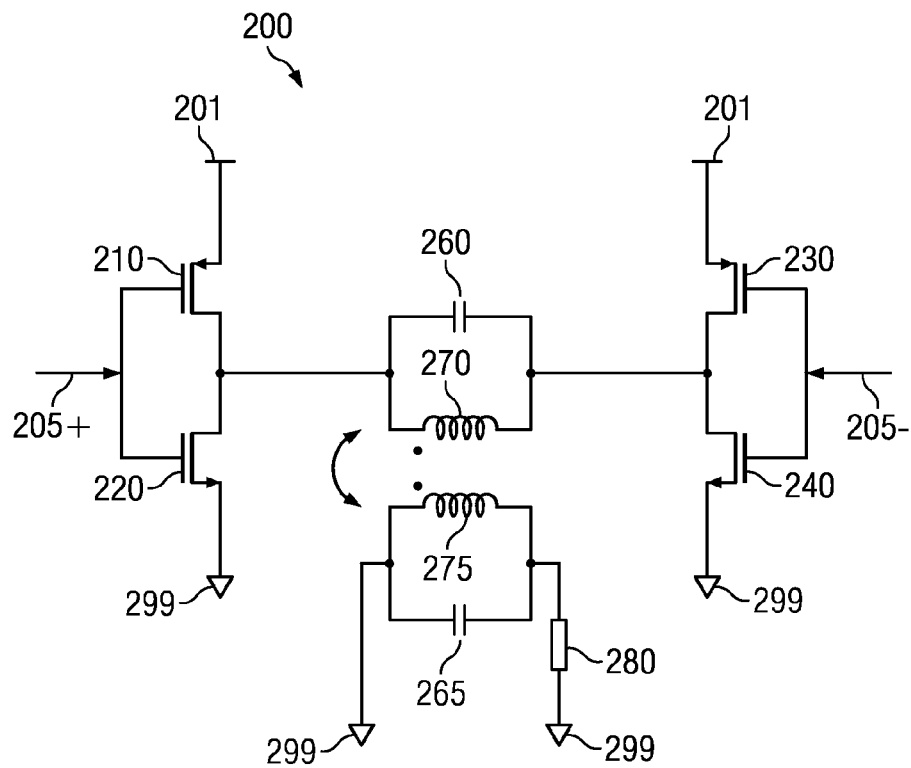
FIG. 2 is a circuit diagram of a prior switched power amplifier.

FIG. 2 is a circuit diagram illustrating the details of a switched power amplifier in a prior embodiment. The diagram depicts a power amplifier 200 implemented using a push-pull topology, and to process differential input signal 205+/205−. Differential input signals 205+/205− may correspond to the input on path 123 provided to power amplifier 130 (FIG. 1).

Transistors 210 and 220 form one arm of the differential-input push-pull topology, and transistors 230 and 240 form the other arm of differential-input push-pull topology of power amplifier 200. Each arm (formed of a CMOS pair) receives the corresponding input (205+ and 205−) of the differential input.

The output of each of the arms is connected to a tuned circuit formed by the parallel connection of capacitor 260 and inductor 270, which may be tuned to resonate at a frequency (e.g., 2.4 GHz in the context of Bluetooth RF signals) of the differential input 205+/205−. Inductor 270 is inductively coupled to inductor 275, with the coupling sense being denoted by the dots shown in FIG. 2. The parallel connection of inductor 275 and capacitor 265 may also be designed to resonate at the frequency of differential input signals 205+/205−. Load 280 represents the load connected to power amplifier 200, and may correspond to the impedance looking-in at path 134 towards matching network 140.

Since power amplifier 200 is designed to amplify a differential signal, two CMOS push-pull pairs are required as shown in FIG. 2. Correspondingly, each of inputs 205+ and 205− may need to be provided by a corresponding driver circuit (not shown), thus requiring two driver circuits. The requirement for two driver circuits may translate to reduced efficiency of power amplifier 200. Further, at least when used at high frequencies (such as, for example, Bluetooth RF signal frequency band) the transition periods between the 'ON' and 'OFF' states of PMOS and NMOS transistors may overlap. During such an overlap period, both transistors of the CMOS pairs may simultaneously be in the 'ON' state. Each CMOS pair consumes power during such overlap durations, further reducing the efficiency of power amplifier 200.

It may thus be desirable to implement switched power amplifier 130 using topologies providing higher efficiencies, as described next.

3. Switched Power Amplifier Topology Enabling Higher Efficiency

Figure 3:
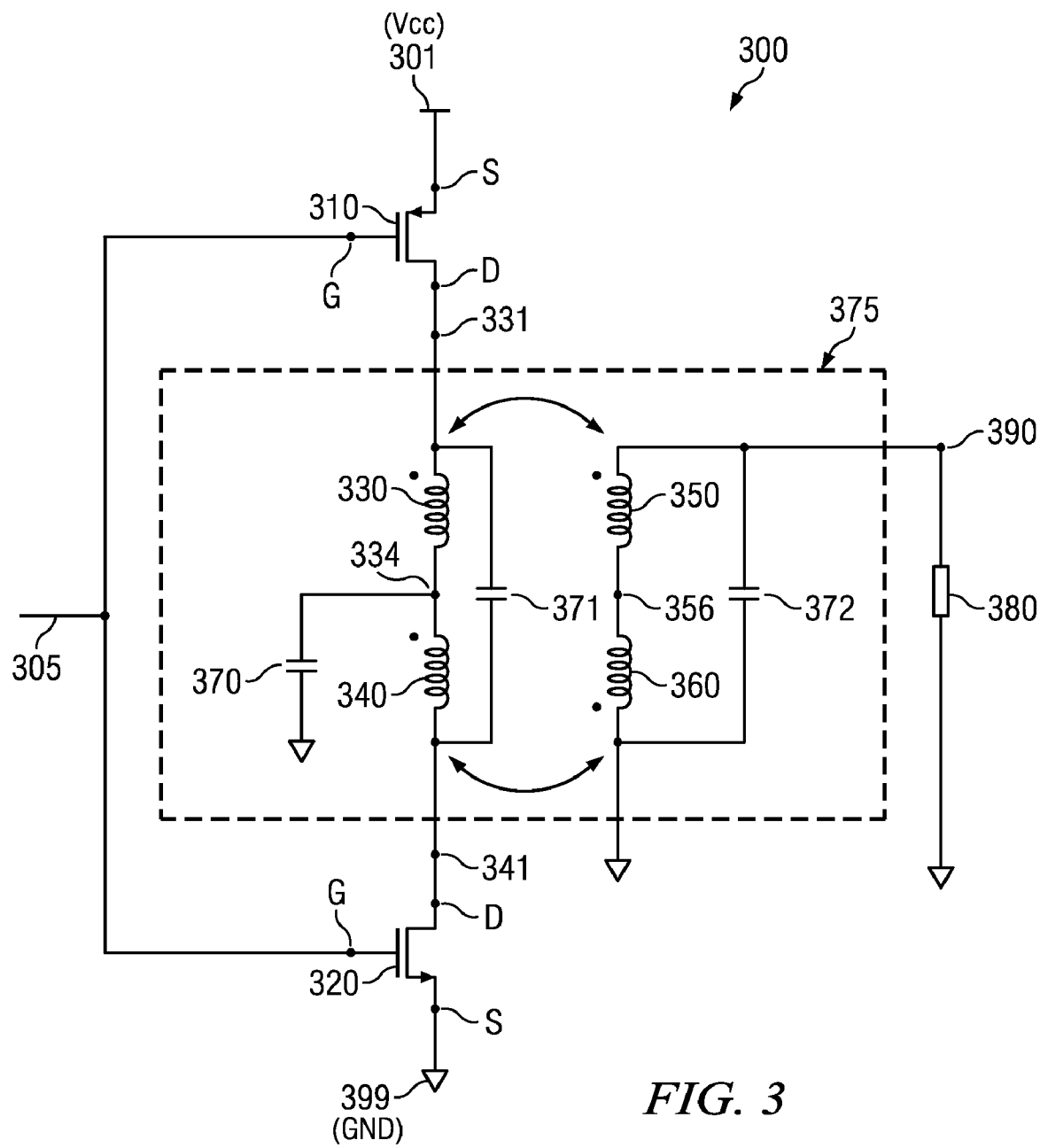
FIG. 3 is a circuit diagram of a switched power amplifier in an embodiment.

FIG. 3 is a circuit diagram of a switched power amplifier in an embodiment. The diagram illustrates the details of switched power amplifier 300 implemented using a topology that enables higher efficiency. Power amplifier 300 is implemented to process single-ended input signal 305, and may be used in place of power amplifier 130 of FIG. 1 with input signal path 305 corresponding to path 123 of FIG. 1. Terminals 301 and 399 respectively represented power supply (Vcc) and ground (GND) terminals. Gate, source and drain terminals of each of transistors 310 and 320 are respectively marked G, S and D.

Single-ended input 305 is provided between the gate terminals of PMOS transistor 310 and NMOS transistor 320, and ground 399. The source terminals of transistors 310 and 320 are connected to power supply 301 (Vcc) and ground 399 (GND) respectively. Input 305 may be provided by a driver circuit, not shown. The single-ended output (power amplified version of input 305) of power amplifier 300 is provided across terminals 390 and GND.

Load coupling block 375 is shown containing inductors 330, 340, 350 and 360, and capacitors 370, 371 and 372. In an embodiment, each of inductors 330, 340, 350 and 360 has a value of 1 nanoHenry, and each of capacitors 370, 371 and 372 has a value of 2 picoFarads. Inductors 330 and 340 in combination with capacitor 371 form a tuned circuit, referred to as input tuned circuit for convenience. Inductor 330 is connected between the drain terminal of PMOS transistor 310 and one terminal of inductor 340. The other terminal of inductor 340 is connected to the drain terminal of NMOS transistor 320. The junction of inductors 330 and 340 is connected to GND 399 through capacitor 370. The connection of capacitor 370 serves to provide a ground (return) path for single-ended input signal 305. Capacitance of capacitor 370 is selected to offer very low impedance relative to the impedance of inductors 330 and 340 at the frequency of operation (e.g. RF frequency of Bluetooth signals) operating frequency. Nodes 331 and 341 may be viewed as terminals of the input tuned circuit, while nodes 390 and 399 (GND) may be viewed as terminals of the output tuned circuit.

Inductors 350 and 360, with capacitor 372, form another tuned circuit, referred to as output tuned circuit. Both input and output tuned circuits are tuned to the frequency of single-ended input signal 305 (which may, for example, be at Radio Frequencies corresponding to Bluetooth specifications). The combination of capacitor 371 and inductors 330 and 340 forms a parallel tuned network (input tuned circuit), which provides high impedance at the frequency of operation. Similarly, combination of capacitor 372 and inductors 350 and 360 forms another parallel tuned network (output tuned circuit), which provides high impedance at the frequency of operation.

The input and output tuned circuits are inductively coupled, with the coupling sense being indicated by the dot notation shown in FIG. 3. Inductor 330 of the input tuned circuit is inductively coupled in phase to inductor 350 of the output tuned circuit. Inductor 340 of the input tuned circuit is inductively coupled to inductor 360 of the output tuned circuit 180° out of phase. In an embodiment, the inductive coupling between inductors 330 and 350 as well as the inductive coupling between inductors 340 and 360 each has a ratio of 1:1. Load 380 is connected to the output tuned circuit in single-ended form between output terminal 390 and GND 399.

Single-ended input signal 305 is provided (by a corresponding driver circuit, not shown) in the form of a pulse train, with the voltage levels of the pulses being switched between levels Vcc 301 and GND 399, thereby ensuring that transistors 310 and 320 are operated in a switched manner, as described below. The pulse train may be modulated (for example, using pulse width modulation) to carry information (data) to be transmitted (by antenna 150 of FIG. 1). The pulses of the pulse train are applied to the gate terminals of transistors 310 and 320, as noted above. The pulses representing input signal 305 switch between voltage levels Vcc 301 and GND 399. While input signal 305 is described as a pulsed signal with amplitude switching between voltages Vcc 301 and GND 399, input signal 305 may be designed to be a non-pulsed waveform also. However, in such a scenario, the efficiency obtained from power amplifier 300 may be less than when input signal 305 is a pulsed/switching waveform.

Input signal 305 (and hence the output signal across terminals 390 and GND) may span (contain) corresponding bands of frequencies centered on a carrier frequency, as may be employed by up-conversion block 120 (FIG. 1). Hence the term 'frequency of operation' may be viewed as being the center frequency, with frequency components greater than and less than the center frequency in a manner determined by the type of modulation employed in baseband processing block 110. Hence, the input tuned circuit and output tuned circuit are designed to offer maximum impedance at the center frequency of the band of frequencies occupied by input signal 305 (which also equals the center frequency of the band of frequencies occupied by the output signal provided across terminal 390 and GND). The impedances offered by the input tuned circuit and output tuned circuit at frequencies greater than and less than the center frequency may be lesser than the impedance offered at the center frequency, based on the Q factor of the respective input and output tuned circuits. Hence, degree of power amplification provided by power amplifier 300 to different frequency components of input signal 305 may all be the same, or different.

In operation, when input signal 305 is at a voltage level equal to GND, NMOS transistor 320 is switched OFF and PMOS transistor 310 is switched ON. The average value of node 334 is Vcc/2 volts. The voltages at the drain terminals of transistors 310 and 320 are each at Vcc volts. Thus, the voltage between drain terminal of transistor 310 and node 334 (i.e., the voltage across inductor 330) equals (+Vcc/2) volts, and the voltage between node 334 and the drain terminal of transistor 320 (i.e. the voltage across inductor 340) equals (−Vcc/2) volts. Due to in-phase coupling between inductors 330 and 350, the voltage induced across terminals 390 and 356 (i.e. across inductor 350) is (+Vcc/2) volts. Due to 180 degrees out-of-phase coupling between inductors 340 and 360, the voltage induced across terminals 356 and GND 399 (i.e. across inductor 360) is also (+Vcc/2) volts. As a result the voltage across terminals 390 and GND 399 (i.e., across load 380) equals (+Vcc) volts.

When input signal 305 is at a voltage level equal to Vcc, NMOS transistor 320 is switched ON and PMOS transistor 310 is switched OFF. The average value of node 334 is Vcc/2 volts. The voltages at the drain terminals of transistors 310 and 320 are each at GND (0 volts). Thus, the voltage between drain terminal of transistor 310 and node 334 (i.e., the voltage across inductor 330) equals (−Vcc/2) volts, and the voltage between node 334 and the drain terminal of transistor 320 (i.e., the voltage across inductor 340) equals (+Vcc/2) volts. Due to in-phase coupling between inductors 330 and 350, the voltage induced across terminals 390 and 356 (i.e., across inductor 350) is (−Vcc/2) volts. Due to 180 degrees out-of-phase coupling between inductors 340 and 360, the voltage induced across terminals 356 and GND 399 (i.e., across inductor 360) is also (−Vcc/2) volts. As a result the voltage across terminals 390 and GND 399 (i.e., across load 380) equals (−Vcc) volts.

Thus, output voltage across load 380 swings between (+Vcc) and (−Vcc), for an input (305) swing of GND to Vcc. Load 380 represents the load connected to power amplifier 300, and may correspond to the impedance looking-in at path 134 towards matching network 140 (FIG. 1). Load 380 may be designed to typically have a value of 50 ohms or 75 ohms, and a power amplified output version of input 305 is provided across load 380.

Since transistors 310 and 320 are operated as switches (to be either ON or OFF), power dissipation in transistors 310 and 320 is minimized. Power amplifier 300 is implemented with a topology to process a single-ended input, and hence with only a single CMOS transistor pair (transistors 310 and 320). It is noted that the operation of the CMOS pair (and hence of power amplifier 300) is in a push-pull fashion, and accordingly power amplifier 300 may also be referred to as a push-pull amplifier with a single-ended input and a single-ended output. Since only a single CMOS transistor pair is employed, only one driver circuit to drive signal 305 is required (as against two CMOS driver circuits in the circuit of FIG. 2).

As a result, power consumed by power amplifier 300 is reduced, thereby resulting in better power amplifier efficiency. Further, since a single CMOS pair is required, power consumed by power amplifier 300 during overlap periods of the 'ON' states of PMOS and NMOS transistors is reduced by half, compared to that in the circuit of FIG. 2. Thus, the topology of power amplifier 300 enables higher efficiency for switched power amplifiers. In an embodiment, power amplifier 300 is implemented with component values to enable total current drawn from a 3.6V power source (Vcc, which, for example, may be provided by a battery) to be 22 milliAmperes to deliver a power of 13 dBm to load 380.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

Furthermore, though the terminals are shown with direct connections to various other terminals, it should be appreciated that additional components (as suited for the specific environment) may also be present in the path, and accordingly the connections may be viewed as being electrically coupled to the same connected terminals.

References throughout this specification to "one embodiment", "an embodiment", or similar language mean that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

While various embodiments have been described above, it should be understood that they have been presented by way of example only and not limitation. Thus, the breadth and scope of the present invention should not be limited by any of the above-described embodiments, but should be defined only in accordance with the following claims and their equivalents.

What is claimed is:

1. A switched power amplifier comprising:
   A. an input receiving a single-ended input signal and an output carrying a single-ended output signal, the single-ended output signal being a power-amplified version of the single-ended input signal;
   B. a first transistor and a second transistor; and
   C. a load coupling block containing an input tuned circuit and an output tuned circuit, each of the input tuned circuit and the output tuned circuit being tuned to a center frequency of a band of frequencies occupied by the single-ended output signal;
   D. wherein control terminals of each of the first transistor and the second transistor receive the single ended input signal,
   E. wherein the single-ended input signal causes the first transistor and the second transistor to operate in a switched manner, and
   F. wherein the output tuned circuit generates the single-ended output signal at a terminal of the output tuned circuit.

2. The circuit of claim 1, wherein the input tuned circuit comprises a first inductor and a second inductor, and the output tuned circuit comprises a third inductor and a fourth inductor, wherein the first inductor and the third inductor are inductively coupled in-phase, and the second inductor and the fourth inductor are inductively coupled out-of-phase.

3. The circuit of claim 2, wherein a first current terminal of the first transistor is coupled to a first terminal of the input tuned circuit, a second current terminal of the first transistor being coupled to a first constant reference potential, wherein a first current terminal of the second transistor is coupled to a second terminal of the input tuned circuit, a second current terminal of the second transistor being coupled to a second constant reference potential.

4. The circuit of claim 3, further comprising: a first capacitor coupled between the first terminal and the second terminal of the input tuned circuit; and a second capacitor coupled between the first terminal and the second terminal of the output tuned circuit, wherein the single-ended output signal is provided at the second terminal of the output tuned circuit, wherein the capacitance of the first capacitor in combination with the inductances of the first inductor and the second inductor are selected to cause the input tuned circuit to have a high impedance at the center frequency of the single-ended output signal, and wherein the capacitance of the second capacitor in combination with the inductances of the third inductor and the fourth inductor are selected to cause the output tuned circuit to have a high impedance at the center frequency of the single-ended output signal.

5. The circuit of claim 4, further comprising a third capacitor coupled between the second constant reference potential and a junction of the first inductor and the second inductor, the capacitance of the third capacitor selected to cause the junction to operate as a ground terminal for the band of frequencies occupied by the single-ended input signal.

6. A device comprising:
   A. a baseband processing block to generate a transmit signal carrying data;
   B. an up-conversion block to translate a frequency band occupied by the transmit signal from a lower frequency band to a higher frequency band to generate a frequency-translated transmit signal;
   C. a switched power amplifier to provide power amplification for the frequency-translated transmit signal and to generate a power-amplified signal; and
   D. an antenna to transmit the power-amplified signal, wherein the switched power amplifier receives a single-ended input signal on an input and generates a single-ended output signal on an output, wherein the single-ended output signal is an amplified version of the single-ended input signal, wherein the single-ended input signal includes the frequency-translated transmit signal, and the single-ended output signal includes the power-amplified signal;
   E. wherein the switched power amplifier includes a first transistor and a second transistor; and a load coupling block containing an input tuned circuit and an output tuned circuit, each of the input tuned circuit and the output tuned circuit being tuned to a center frequency of a band of frequencies occupied by the single-ended output signal, wherein control terminals of each of the first transistor and the second transistor receive the single ended input signal, wherein the single-ended input signal causes the first transistor and the second transistor to operate in a switched manner, wherein the output tuned circuit generates the single-ended output signal at a terminal of the output tuned circuit.

7. The device of claim 6, wherein the input tuned circuit comprises a first inductor and a second inductor, and the output tuned circuit comprises a third inductor and a fourth inductor, wherein the first inductor and the third inductor are inductively coupled in-phase, and the second inductor and the fourth inductor are inductively coupled out-of-phase.

8. The device of claim 7, wherein a first current terminal of the first transistor is coupled to a first terminal of the input tuned circuit, a second current terminal of the first transistor being coupled to a first constant reference potential, wherein a first current terminal of the second transistor is coupled to a second terminal of the input tuned circuit, a second current terminal of the second transistor being coupled to a second constant reference potential.

9. The device of claim 8, further comprising: a first capacitor coupled between the first terminal and the second terminal of the input tuned circuit; and a second capacitor coupled between the first terminal and the second terminal of the output tuned circuit, wherein the single-ended output signal is provided at the second terminal of the output tuned circuit, wherein the capacitance of the first capacitor in combination with the inductances of the first inductor and the second inductor are selected to cause the input tuned circuit to have a high impedance at the center frequency of the single-ended output signal, and wherein the capacitance of the second capacitor in combination with the inductances of the third inductor and the fourth inductor are selected to cause the output tuned circuit to have a high impedance at the center frequency of the single-ended output signal.

10. The device of claim 9, further comprising a third capacitor coupled between the second constant reference potential and a junction of the first inductor and the second inductor, the capacitance of the third capacitor selected to cause the junction to operate as a ground terminal for the band of frequencies occupied by the single-ended input signal.

* * * * *